(12) United States Patent
Hashimoto et al.

(10) Patent No.: US 9,834,863 B2
(45) Date of Patent: Dec. 5, 2017

(54) GROUP III NITRIDE BULK CRYSTALS AND FABRICATION METHOD

(71) Applicants: SIXPOINT MATERIALS, INC., Buellton, CA (US); SEOUL SEMICONDUCTOR CO., LTD., Seoul (KR)

(72) Inventors: Tadao Hashimoto, Santa Barbara, CA (US); Edward Letts, Buellton, CA (US)

(73) Assignees: SixPoint Materials, Inc., Buelton, CA (US); Seoul Semiconductor Co., Ltd., Ansan-si (KR)

( * ) Notice: Subject to any disclaimer, the term of this patent is extended or adjusted under 35 U.S.C. 154(b) by 383 days.

(21) Appl. No.: 14/598,982

(22) Filed: Jan. 16, 2015

(65) Prior Publication Data

US 2015/0203991 A1  Jul. 23, 2015

Related U.S. Application Data

(60) Provisional application No. 61/928,883, filed on Jan. 17, 2014.

(51) Int. Cl.
*C30B 29/40* (2006.01)
*C30B 7/10* (2006.01)

(52) U.S. Cl.
CPC ............ *C30B 29/403* (2013.01); *C30B 7/105* (2013.01)

(58) Field of Classification Search
CPC .................................. C30B 29/40; C30B 7/10
See application file for complete search history.

(56) References Cited

U.S. PATENT DOCUMENTS

| 6,656,615 B2 | 12/2003 | Dwiliński et al. |
| 7,078,731 B2 | 7/2006 | D' Eyelyn et al. |

(Continued)

FOREIGN PATENT DOCUMENTS

| WO | WO2007008198 A1 | 1/2007 |
| WO | WO2007117689 A2 | 10/2007 |

(Continued)

OTHER PUBLICATIONS

PCT/US2015/011793 International Search Report and Written Opinion dated Mar. 26, 2015, pp. 13.

(Continued)

*Primary Examiner* — Robert M Kunemund
(74) *Attorney, Agent, or Firm* — Strategic Innovation IP Law Offices, P.C.

(57) ABSTRACT

Bulk crystal of group III nitride having thickness greater than 1 mm with improved crystal quality, reduced lattice bowing and/or reduced crack density and methods of making. Bulk crystal has a seed crystal, a first crystalline portion grown on the first side of the seed crystal and a second crystalline portion grown on the second side of the seed crystal. Either or both crystalline portions have an electron concentration and/or an oxygen concentration similar to the seed crystal.

The bulk crystal can have an additional seed crystal, with common faces (e.g. same polarity, same crystal plane) of seed crystals joined so that a first crystalline part grows on the first face of the first seed crystal and a second crystalline part grows on the first face of the second seed crystal. Each crystalline part's electron concentration and/or oxygen concentration may be similar to its corresponding seed crystal.

28 Claims, 4 Drawing Sheets

---

1. Preparation of seed crystal(s)

↓

2. Attaching the second side of the first seed crystal to the second side of the second seed crystal

↓

3. Growing the first crystalline part on the first side of the first seed crystal and the second crystalline part on the first side of the second seed crystal simultaneously in supercritical ammonia

(56) References Cited

U.S. PATENT DOCUMENTS

| | | | |
|---|---|---|---|
| 7,132,730 | B2 | 11/2006 | Dwiliński et al. |
| 7,160,388 | B2 | 1/2007 | Dwiliński et al. |
| 8,507,364 | B2* | 8/2013 | Nagai ................. C30B 9/10 257/183 |
| 2003/0157376 | A1* | 8/2003 | Vaudo ................. C30B 23/00 428/698 |
| 2007/0234946 | A1 | 10/2007 | Hashimoto et al. |
| 2009/0191659 | A1* | 7/2009 | Song ................. C30B 25/18 438/46 |

FOREIGN PATENT DOCUMENTS

| | | |
|---|---|---|
| WO | WO2009149299 A1 | 12/2009 |
| WO | WO2010017232 A1 | 2/2010 |
| WO | WO2011044554 A1 | 4/2011 |
| WO | WO2012176318 A1 | 12/2012 |
| WO | WO2015109211 A1 | 7/2015 |

OTHER PUBLICATIONS

EP 15702083.5 Communication dated Sep. 20, 2016.
EP 15702083.5 Response and amendment dated Mar. 28, 2017.

* cited by examiner

GROUP III NITRIDE BULK CRYSTALS AND FABRICATION METHOD

CROSS REFERENCE TO RELATED APPLICATIONS

This application claims the benefit of priority to U.S. Application No. 61/928,883 entitled "Group III Nitride Bulk Crystals and Their Fabrication Method" filed Jan. 17, 2014 and naming inventors Tadao Hashimoto and Edward Letts, which is incorporated by reference herein in its entirety as if put forth in full below.

This application is related to the PCT patent application entitled "Group III Nitride Bulk Crystals and Fabrication Method" filed on the same date as the present patent application and naming inventors Tadao Hashimoto and Edward Letts, which application is incorporated by reference herein in its entirety as if put forth in full below.

This application is also related to the following U.S. patent applications:

US Utility Patent Application Serial No. US2005/024239, filed on Jul. 8, 2005, by Kenji Fujito, Tadao Hashimoto and Shuji Nakamura, entitled "METHOD FOR GROWING GROUP III-NITRIDE CRYSTALS IN SUPERCRITICAL AMMONIA USING AN AUTOCLAVE,";

U.S. Utility patent application Ser. No. 11/784,339, filed on Apr. 6, 2007, by Tadao Hashimoto, Makoto Saito, and Shuji Nakamura, entitled "METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS,", which application claims the benefit under 35 U.S.C. Section 119(e) of U.S. Provisional Patent Application Ser. No. 60/790,310, filed on Apr. 7, 2006, by Tadao Hashimoto, Makoto Saito, and Shuji Nakamura, entitled "A METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS,";

U.S. Utility Patent Application Ser. No. 60/973,602, filed on Sep. 19, 2007, by Tadao Hashimoto and Shuji Nakamura, entitled "GALLIUM NITRIDE BULK CRYSTALS AND THEIR GROWTH METHOD,";

U.S. Utility patent application Ser. No. 11/977,661, filed on Oct. 25, 2007, by Tadao Hashimoto, entitled "METHOD FOR GROWING GROUP III-NITRIDE CRYSTALS IN A MIXTURE OF SUPERCRITICAL AMMONIA AND NITROGEN, AND GROUP III-NITRIDE CRYSTALS GROWN THEREBY,";

U.S. Utility Patent Application Ser. No. 61/067,117, filed on Feb. 25, 2008, by Tadao Hashimoto, Edward Letts, Masanori Ikari, entitled "METHOD FOR PRODUCING GROUP III-NITRIDE WAFERS AND GROUP III-NITRIDE WAFERS,";

U.S. Utility Patent Application Ser. No. 61/058,900, filed on Jun. 4, 2008, by Edward Letts, Tadao Hashimoto, Masanori Ikari, entitled "METHODS FOR PRODUCING IMPROVED CRYSTALLINITY GROUP III-NITRIDE CRYSTALS FROM INITIAL GROUP III-NITRIDE SEED BY AMMONOTHERMAL GROWTH,";

U.S. Utility Patent Application Ser. No. 61/058,910, filed on Jun. 4, 2008, by Tadao Hashimoto, Edward Letts, Masanori Ikari, entitled "HIGH-PRESSURE VESSEL FOR GROWING GROUP III NITRIDE CRYSTALS AND METHOD OF GROWING GROUP III NITRIDE CRYSTALS USING HIGH-PRESSURE VESSEL AND GROUP III NITRIDE CRYSTAL,";

U.S. Utility Patent Application Ser. No. 61/131,917, filed on Jun. 12, 2008, by Tadao Hashimoto, Masanori Ikari, Edward Letts, entitled "METHOD FOR TESTING III-NITRIDE WAFERS AND III-NITRIDE WAFERS WITH TEST DATA,";

U.S. Utility Patent Application Ser. No. 61/106,110, filed on Oct. 16, 2008, by Tadao Hashimoto, Masanori Ikari, Edward Letts, entitled "REACTOR DESIGN FOR GROWING GROUP III NITRIDE CRYSTALS AND METHOD OF GROWING GROUP III NITRIDE CRYSTALS,";

U.S. Utility Patent Application Ser. No. 61/694,119, filed on Aug. 28, 2012, by Tadao Hashimoto, Edward Letts, Sierra Hoff, entitled "GROUP III NITRIDE WAFER AND PRODUCTION METHOD,";

U.S. Utility Patent Application Ser. No. 61/705,540, filed on Sep. 25, 2012, by Tadao Hashimoto, Edward Letts, Sierra Hoff, entitled "METHOD OF GROWING GROUP III NITRIDE CRYSTALS,";

which applications are incorporated by reference herein in their entireties as if put forth in full below.

BACKGROUND

Field of the Invention

The invention relates to a bulk crystal of semiconductor material used to produce semiconductor wafers for various devices including optoelectronic devices such as light emitting diodes (LEDs) and laser diodes (LDs), and electronic devices such as transistors. More specifically, the invention provides a bulk crystal of group III nitride such as gallium nitride. The invention also provides various methods of making these crystals.

Description of the Existing Technology

This document refers to several publications and patents as indicated with numbers within brackets, e.g., [x]. Following is a list of these publications and patents:

[1] R. Dwiliński, R. Doradziński, J. Garczyński, L. Sierzputowski, Y. Kanbara, U.S. Pat. No. 6,656,615.
[2] R. Dwiliński, R. Doradziński, J. Garczyński, L. Sierzputowski, Y. Kanbara, U.S. Pat. No. 7,132,730.
[3] R. Dwiliński, R. Doradziński, J. Garczyński, L. Sierzputowski, Y. Kanbara, U.S. Pat. No. 7,160,388.
[4] K. Fujito, T. Hashimoto, S. Nakamura, International Patent Application No. PCT/US2005/024239, WO07008198.
[5] T. Hashimoto, M. Saito, S. Nakamura, International Patent Application No. PCT/US2007/008743, WO07117689. See also US20070234946, U.S. application Ser. No. 11/784,339 filed Apr. 6, 2007.
[6] D'Evelyn, U.S. Pat. No. 7,078,731.

Each of the references listed in this document is incorporated by reference in its entirety as if put forth in full herein, and particularly with respect to their description of methods of making and using group III nitride substrates.

Gallium nitride (GaN) and its related group III nitride alloys are the key material for various optoelectronic and electronic devices such as LEDs, LDs, microwave power transistors, and solar-blind photo detectors. Currently LEDs are widely used in displays, indicators, general illuminations, and LDs are used in data storage disk drives. However, the majority of these devices are grown epitaxially on heterogeneous substrates, such as sapphire and silicon carbide because GaN substrates are extremely expensive compared to these heteroepitaxial substrates. The heteroepitaxial growth of group III nitride causes highly defected or even cracked films, which hinder the realization of high-end optical and electronic devices, such as high-brightness LEDs for general lighting or high-power microwave transistors.

To solve fundamental problems caused by heteroepitaxy, it is indispensable to utilize crystalline group III nitride wafers sliced from bulk group III nitride crystal ingots. For the majority of devices, crystalline GaN wafers are favorable because it is relatively easy to control the conductivity of the wafer and GaN wafer will provide the smallest lattice/thermal mismatch with device layers. However, due to the high melting point and high nitrogen vapor pressure at elevated temperature, it has been difficult to grow GaN crystal ingots. Currently, the majority of commercially available GaN substrates are produced by a method called hydride vapor phase epitaxy (HVPE). HVPE is a vapor phase method, which has difficulty in reducing dislocation density less than $10^5$ cm$^{-2}$.

To obtain high-quality GaN substrates for which dislocation density is less than $10^5$ cm$^{-2}$, a new method called ammonothermal growth has been developed [1-6]. Recently, high-quality GaN substrates having dislocation density less than $10^5$ cm$^2$ can be obtained by ammonothermal growth. Since this ammonothermal method can produce a true bulk crystal, one can grow one or more thick crystals and slice them to produce GaN wafers. One or more dopants may also be incorporated during ammonothermal growth to affect donor concentration (i.e. electron concentration), acceptor concentration (i.e. hole concentration) or magnetic impurity concentrations (confer [1]). However, it is challenging to improve crystal quality, reduce crystal bowing and/or reduce cracking for bulk crystals which exceed approximately 1 mm in thickness.

SUMMARY OF THE INVENTION

In one instance, the invention can provide a bulk crystal of group III nitride having a thickness of more than about 1 mm with improved crystal quality, reduced lattice bowing and/or reduced crack density. This bulk group III nitride crystal is expressed as $Ga_xAl_yIn_{1-x-y}N$ ($0 \leq x \leq 1$, $0 \leq x+y \leq 1$) and has the following three parts: a first seed crystal, a first crystalline part grown on a first side of the first seed crystal, and a second crystalline part grown on a second side of the first seed crystal. Either of the crystalline parts has an electron concentration or oxygen concentration approximately the same as the electron concentration or oxygen concentration of the seed crystal.

The bulk crystal can optionally have the following four parts: a first seed crystal, a first crystalline part grown on a first side of the first seed crystal, a second seed crystal, and a second crystalline part grown on a first side of the second seed crystal. In this case, the second side of the second seed crystal is attached to the second side of the first seed crystal, and the each crystalline part has similar electron concentration or oxygen concentration to their corresponding seed crystals. The second side of the second seed crystal has a similar property to the second side of the first seed crystal. For example, the second side of each of the first and second seed crystals may have the same crystal property, e.g. the second side of each of the first and second seed crystals may be nitrogen-polar, or the second side of each of the first and second seed crystals may be group III-polar.

Also disclosed herein are various fabrication methods for the bulk crystal of group III nitride explained above. The seed crystals are preferably prepared with the ammonothermal method.

BRIEF DESCRIPTION OF THE DRAWINGS

Referring now to the drawings in which like reference numbers represent corresponding parts throughout.

In the figure each number represents the followings:
1. The first seed crystal
2. The first crystalline part grown on the first side of the first seed crystal
3. The second crystalline part grown on the second side of the first seed crystal
8. First major face of the seed crystal
9. Second major face of the seed crystal
10. First major face of the bulk crystal
11. Second major face of the bulk crystal

Figure 3:
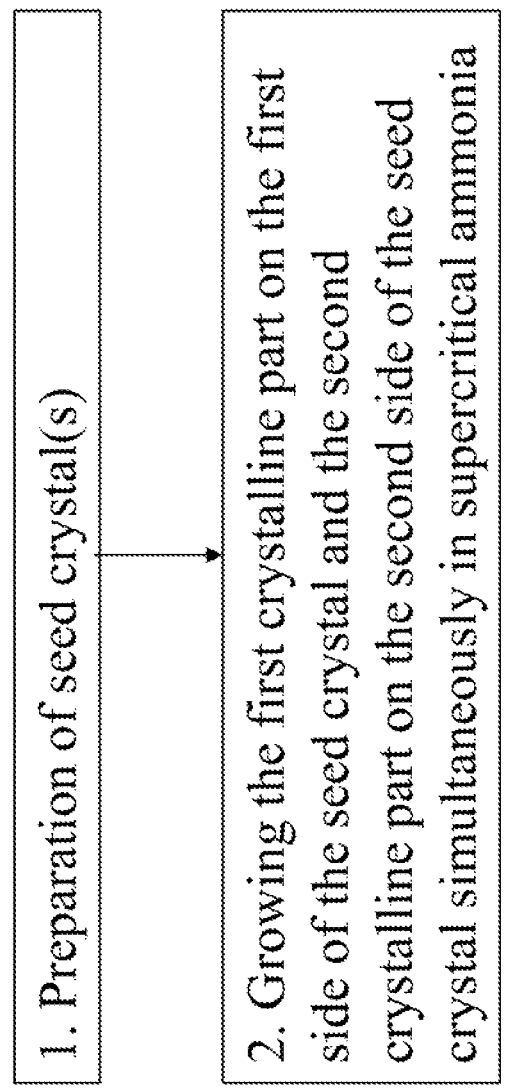

In the figure each number represents the followings:
4. The first seed crystal
5. The first crystalline part grown on the first side of the first seed crystal
6. The second seed crystal
7. The second crystalline part grown on the first side of the second seed crystal
12. First major face of the first seed crystal
13. Second major face of the first seed crystal
14. First major face of the second seed crystal
15. Second major face of the second seed crystal
16. First major face of the bulk crystal
17. Second major face of the bulk crystal FIG. 3 provides a flow diagram for a method described herein.

Figure 4:
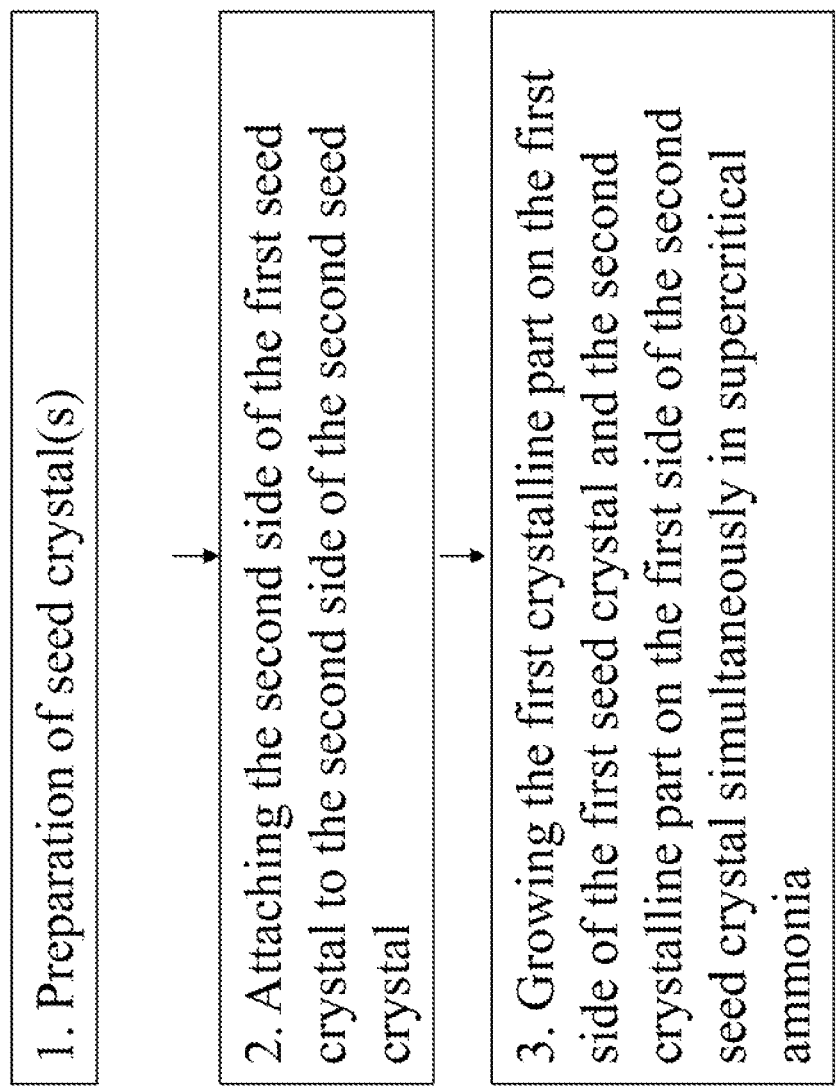

FIG. 4 provides a flow diagram for another method described herein.

DETAILED DESCRIPTION OF THE INVENTION

Overview

The bulk crystal of the present invention is typically sliced to produce group III nitride wafers suitable for fabricating various optoelectronic and electronic devices such as LEDs, LD, transistors, and photodetectors. Many optoelectronic and electronic devices are fabricated with thin films of group III nitride alloys (i.e. alloys of GaN, AlN and InN). Due to limited availability and high cost of single crystalline substrates of group III nitride, these devices have been fabricated on so-called heteroepitaxial substrates such as sapphire and silicon carbide. Since the heteroepitaxial substrates are chemically and physically different from the group III nitride, the device typically has a high density of dislocations ($10^8$-$10^{10}$ cm$^{-2}$) generated at the interface between the heteroepitaxial substrate and the device layer. Such dislocations deteriorate performance and reliability of devices, thus substrates composed of crystalline group III nitride such as GaN and AlN have been developed.

Currently, the majority of commercially available GaN substrates are produced with HVPE, in which it is difficult to reduce the dislocation density to less than $10^5$ cm$^{-2}$. Although the dislocation density of HVPE-GaN substrates is a few orders of magnitude lower than GaN film on heteroepitaxial substrates, the dislocation density is still a few orders of magnitude higher than typical silicon devices in electronics. To achieve higher device performance, lower dislocation density is required.

To attain dislocation density less than $10^5$ cm$^{-2}$, ammonothermal growth, which utilizes supercritical ammonia, has been developed. The ammonothermal method can produce GaN substrates with dislocation density less than $10^5$ cm$^{-2}$. One advantage of the ammonothermal method is that bulk crystals having a thickness greater than 1 mm can be grown.

The ammonothermal method can also be used to grow crystals having various dopants such as donors (i.e. electron), acceptors (i.e. hole) or magnetic dopants. However, it is challenging to obtain a bulk crystal over 1 mm thick with improved crystal quality, reduced lattice curvature or reduced cracking Although the origin and mechanism for poor characteristics of the bulk crystals are unknown, a possible cause would be stress accumulation inside the crystal due to a slight mismatch of thermal expansion coefficient or thermal conductivity caused by difference in electron concentration or oxygen concentration between the seed crystal and grown crystal.

TECHNICAL DESCRIPTION OF THE INVENTION

In an effort to improve crystal quality, reduce lattice bowing, and/or reduce or eliminate cracking inside the bulk crystal of group III nitride having thickness greater than 1 mm, the current invention provides a method of making a bulk crystal of group III nitride in which one or more seed crystals have an electron concentration and/or oxygen concentration that matches the electron concentration and/or oxygen concentration of crystal grown on the seed crystals.

In conventional group III nitride growth processes, the electron concentration of the seed and/or electron concentration of new growth to be formed on a seed is not used as a factor in establishing group III nitride growth conditions in a reactor. In a conventional group III nitride growth process, a seed is first assessed to determine whether the seed has sufficient quality that new growth can be formed on it. Subsequently, conditions within a reactor are selected based on known growth process factors such as temperature, temperature difference, raw material concentration, and time to form new growth on the seed. The seed's properties such as electron concentration and/or oxygen concentration are not used in establishing conditions for new growth in conventional group III nitride processes. The seed is typically determined to be adequate for growth, and then the seed's properties are generally disregarded when selecting growth conditions for new material to be formed on the seed.

Many factors can affect electron concentration in new group III nitride growth on a seed. These factors include amount and type of dopant incorporated into new growth, the quality of the lattice that forms, operating conditions such as temperature in each reactor region, difference in these temperatures, mineralizer type and concentration, raw material concentration, and contaminant concentration.

We have learned that electron concentration and/or oxygen concentration in both the seed and new growth can be an important factor when forming new growth. One method provided by the invention involves making the oxygen concentration of seed and new growth about the same. Consequently, if the seed's oxygen concentration is $10^{19}$ cm$^{-3}$, the growth conditions for new growth are selected to provide an oxygen concentration value of approximately $10^{19}$ cm$^{-3}$ in new growth formed on the seed.

There are various ways of making the electron and/or oxygen concentration in a seed formed in a first reaction sequence and new growth formed in a second, subsequent reaction sequence approximately the same. In one instance, a method involves providing an amount of oxygen during the second reaction sequence so that oxygen concentration of new growth is about the same as oxygen concentration in the seed. This may require addition of oxygen during the second reaction sequence. This may instead or additionally require addition of oxygen during the first reaction sequence. In another instance, a method involves preventing addition of oxygen during the first and/or second reaction sequence. In another instance, a method involves selecting a seed based on its oxygen content and using that seed in a method that provides an oxygen concentration in new growth (with or without oxygen addition) that is approximately the same as the oxygen concentration in the seed.

In any of the methods above, the seed may be formed by a heteroepitaxial process if desired. For instance, the first reaction sequence used to form the seed may be hydride vapor phase epitaxy (HVPE) on sapphire substrate, and the second reaction sequence used to form new growth on the seed may be an ammonothermal process. Alternatively, in any of the methods above, the seed may be formed by a homoepitaxial process. For instance, the first reaction sequence may be HVPE deposition on a group III nitride substrate or an ammonothermal process to form the seed, and the second reaction sequence used to form new growth on the seed may be an ammonothermal process. Another alternative is to use the same type of process to form the seed and new growth. For instance, the first reaction sequence used to form the seed may be an ammonothermal method, and the second, subsequent method used to form new growth on the seed may also be a second ammonothermal method performed after the seed is prepared for new group III nitride deposition. The first and second sequences may instead be e.g. HVPE, MOCVD, or other group III nitride growth methods.

A bulk crystal is provided in methods discussed above. The bulk crystal has a seed having a first oxygen concentration and new growth having a second oxygen concentration, where the first oxygen concentration is about the same as the second oxygen concentration.

Similarly, the bulk crystal has a seed having a first electron concentration and new growth having a second electron concentration, where the first electron concentration is about the same as the second electron concentration. In this case, electron concentration may or may not be adjusted with oxygen doping. A dopant such as silicon, carbon, germanium, sulfur, and/or selenium can be used in a sufficient amount to provide a seed with the desired first electron concentration and/or new growth having the second electron concentration.

Figure 1:
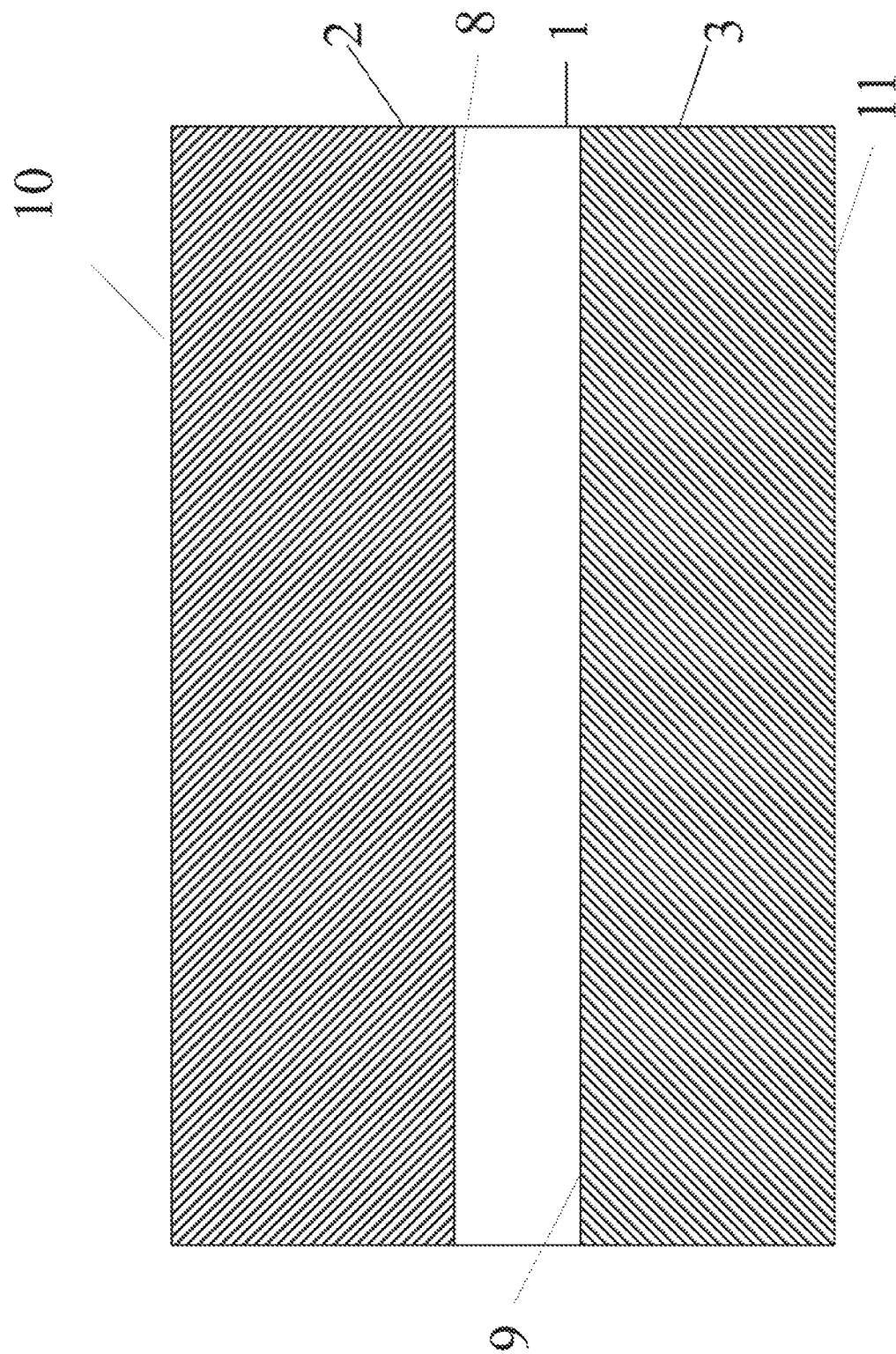
FIG. 1 is a schematic drawing of the bulk crystal of group III nitride.

FIG. 1 presents one example of bulk crystal of this invention. The bulk crystal comprises the seed crystal 1 having electron concentration, $N_{seed}$, and oxygen concentration, $O_{seed}$; the first crystalline part 2 grown on the first side of the seed crystal 1 having electron concentration, $N_{1st-xtal}$, and oxygen concentration, $O_{1st-xtal}$; the optional second crystalline part 3 grown on the second side of the seed crystal 1 having electron concentration, $N_{2nd-xtal}$, and oxygen concentration, $O_{2nd-xtal}$. The electron concentrations may have the following relationships:

$$0.1 < N_{1st-xtal}/N_{seed} < 10 \text{ and/or } 0.1 < N_{2nd-xtal}/N_{seed} < 10$$

or the oxygen concentration may have the following relationships:

$$0.1 < O_{1st-xtal}/O_{seed} < 10 \text{ and/or } 0.1 < O_{2nd-xtal}/O_{seed} < 10.$$

More preferably, the electron concentration has the following relationships:

$$0.5 < N_{1st-xtal}/N_{seed} < 5 \text{ and/or } 0.5 < N_{2nd-xtal}/N_{seed} < 5$$

or the oxygen concentration has the following relationships:

$$0.5 < O_{1st-xtal}/O_{seed} < 5 \text{ and/or } 0.5 < O_{2nd-xtal}/O_{seed} < 5.$$

During the fabrication process of the bulk crystal, the bulk crystal experiences thermal and/or mechanical stress, which can cause crack formation. Although the detailed mechanism is still unknown, matching the electron concentration and/or oxygen concentration of seed and new growth can improve crystal quality, reduce lattice bowing and/or reduce crack formation in the bulk crystal.

Figure 2:
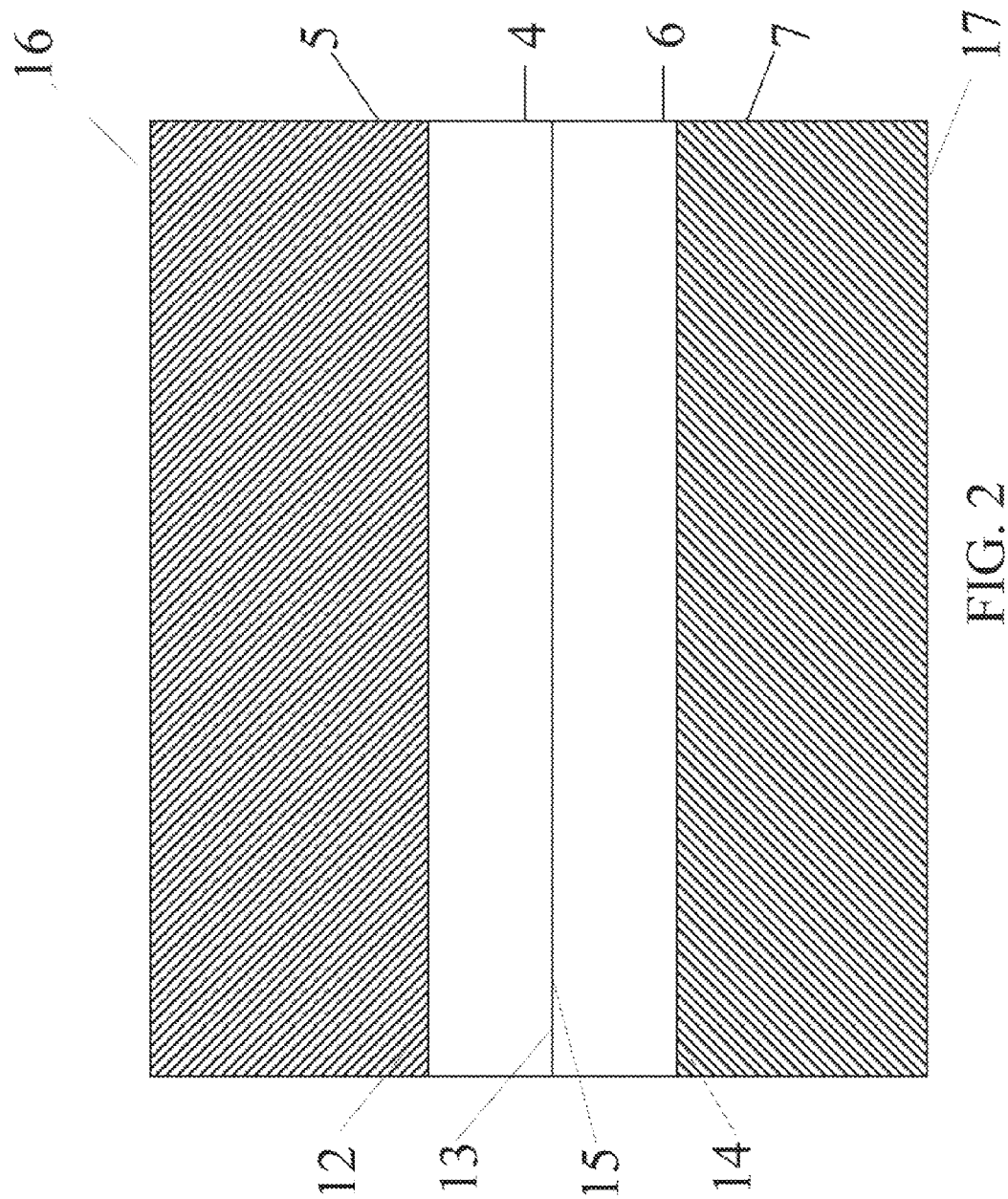
FIG. 2 is a schematic drawing of the bulk crystal of group III nitride.

In one instance, the bulk crystal may comprise four parts as shown in FIG. 2. The first crystalline part 5 is grown on the first side of the first seed crystal 4 and the second crystalline part 7 is grown on the first side of the second seed crystal 6. The first seed crystal 4 and second seed crystal 6 are attached together on the second side of each seed. The electron concentration of the first crystalline part 5, $N_{1st\text{-}xtal}$, the first seed crystal 4, $N_{1seed}$, the second seed crystal 6, $N_{2seed}$, the second crystalline part 7, $N_{2nd\text{-}xtal}$, have the following relationships:

$$0.1 < N_{1st\text{-}xtal}/N_{1seed} < 10 \text{ and/or } 0.1 < N_{2nd\text{-}xtal}/N_{2seed} < 10.$$

The oxygen concentration of the first crystalline part 5, $O_{1st\text{-}xtal}$, the first seed crystal 4, $O_{1seed}$, the second seed crystal 6, $O_{2seed}$, the second crystalline part 7, $O_{2nd\text{-}xtal}$, have the following relationships:

$$0.1 < O_{1st\text{-}xtal}/O_{1seed} < 10 \text{ and/or } 0.1 < O_{2nd\text{-}xtal}/O_{2seed} < 10.$$

More preferably, the electron concentration have the following relationships:

$$0.5 < N_{1st\text{-}xtal}/N_{1seed} < 5 \text{ and/or } 0.5 < N_{2nd\text{-}xtal}/N_{2seed} < 5$$

or the oxygen concentration have the following relationships:

$$0.5 < O_{1st\text{-}xtal}/O1N_{seed} < 5 \text{ and/or } 0.5 < O_{2nd\text{-}xtal}/O_{2seed} < 5.$$

To fabricate the bulk crystal of group III nitride in this invention, ammonothermal growth is preferably utilized because it allows simultaneous growth of crystalline material on both major faces of the seed crystal.

FIG. 3 shows a fabrication flow of bulk crystal having one seed crystal inside the bulk crystal. First, single crystalline seed crystals are prepared. To match the electron concentration or the oxygen concentration with those of grown parts, the seed crystals are preferably grown by the ammonothermal method. Alternatively, the seed crystals can be grown using HVPE, flux method, or other available growth method for free-standing GaN seed crystals. If necessary, the seed crystals can be grown with intentional doping of donors (e.g. silicon) to match the electron concentration or with intentional doping of oxygen to match the oxygen concentration.

By growing crystalline parts on both sides simultaneously, mechanical stress on both sides balances together, thus reducing crystal bowing caused by uneven stress applied to one side. The matching of electron concentration or oxygen concentration between seeds and grown parts are expected to reduce stress, thus to improve crystal quality, reduce lattice bowing or reduce cracking, during or after growth.

If the crystal is grown on both sides of one polar seed, the characteristics of the grown parts may vary depending on the polarity. In such case, the electron concentration or the oxygen concentration of the seed crystal may be matched only to one side. For example, when bulk crystal of GaN is grown on a c-plane GaN seed, the crystal part grown on the N-polar side of the seed has better quality than that on the Ga-polar side. Thus, the electron concentration or the oxygen concentration of the seed is matched only to N-side part of the crystal.

FIG. 4 shows a fabrication flow of bulk crystals having two seed crystals attached together to form a compound seed crystal. Single crystalline seed crystals are prepared in the similar manner as above. When polar (including semipolar) seed crystals, such as c-plane GaN or {11-21} GaN are used, characteristics of crystalline part grown on the seed depend on the polarity of the seed. To obtain similar characteristics on both sides of the seed, it is preferable to use two seed crystals attached together so that the same polar surfaces are exposed on both sides. For example, two c-plane GaN seed crystals are attached together on Ga face, and the composite seed crystal having N-polar faces on both sides can be used for ammonothermal growth.

By growing crystalline parts on both sides simultaneously, mechanical stress on both sides balances, thus reducing crystal bowing caused by uneven stress applied to one side. The matching of electron concentration or oxygen concentration between seeds and grown portions is expected to reduce stress, thus to improve crystal quality, reduce lattice bowing and/or reduce cracking during or after growth via stress reduction.

Example 1 and Comparative Example

Following the process flow in FIG. 3, bulk crystals of GaN are grown simultaneously on two different seed crystals individually. One seed is used to form new growth having an electron concentration and/or an oxygen concentration that matches the expected value of the grown crystal. The other seed is used to form comparative new growth having an electron concentration or oxygen concentration mismatched to the expected value of the grown crystal to verify differences in the quality of new crystalline growth due to matching electron and/or oxygen concentration.

A single crystalline c-plane GaN seed crystal approximately 5 mm×5 mm size with thickness of 463 microns was prepared by an ammonothermal growth process. The seed crystal was sliced from a bulk crystal of GaN grown in the ammonothermal method at about 550° C. in ammonia (50% fill to reactor volume) and sodium (4.5 mol % to ammonia). With this growth condition, the electron concentration can typically be $2 \times 10^{19}$ cm$^{-3}$ and oxygen concentration can typically be $3 \times 10^{19}$ cm$^{-3}$. The full width half maximum (FWHM) of X-ray 002 peak measured on the N-side of this particular seed crystal was 906 arcsec and the curvature radius was 1.8 m (convex towards +c axis).

As a comparison, a single crystalline c-plane GaN seed crystal grown by HVPE in approximately 5 mm×5 mm size was also prepared (HVPE-seed). The HVPE-made Si-doped GaN seed crystal can typically have an electron concentration of $1 \times 10^{18}$ cm$^{-3}$ and oxygen concentration of $5 \times 10^{16}$ cm$^{-3}$. The FWHM of X-ray 002 peak and lattice curvature radius measured on the N-side surface was 552 arcsec and −1.3 m (convex towards −c axis), respectively.

Then, new crystalline portions were grown on both Ga-polar side and N-polar side of each seed above simultaneously in supercritical ammonia. The growth temperature was about 550° C., the ammonia fill factor was 50% and the sodium molar ratio to ammonia was 4.5%. Similar to the case for the ammonothermal seed, the expected carrier concentration and oxygen concentration of the grown crystalline parts are $2 \times 10^{19}$ cm$^{-3}$ and $3 \times 10^{19}$ cm$^{-3}$, respectively.

Since the growth condition for newly-deposited group III nitride is almost identical to that for the ammonothermal seed, the electron concentration and the oxygen concentration for the crystalline parts should essentially match those for the ammonothermal seed.

On the other hand, the calculated ratio of electron concentration of the crystalline part to that of the HVPE-seed is approximately 20, and the calculated ratio of oxygen concentration of the crystalline part to that of the HVPE-seed is approximately 600.

The total thickness of the bulk crystal grown on the ammonothermal seed was 1.3 mm and the X-ray FWHM from 002 diffraction obtained on the N-side crystalline part was reduced to 257 arcsec. This indicates that crystal quality was significantly improved after growth. The curvature radius on the N-side crystalline part increased from 1.8 m to 573 m, which shows flattened crystal lattice. On the N-side of this crystal, no cracks were observed on 5 mm×5 mm surface, thus the crack density was less than 4 cm$^2$.

On the other hand for the comparative example, the total thickness of the bulk crystal grown on the HVPE-seed was 1.5 mm and the X-ray FWHM from 002 diffraction obtained on the N-side crystalline part was 580 arcsec. This shows that crystal quality was not improved. The curvature radius on the N-side crystalline part decreased from −1.3 m to 0.6 m, which indicates more curved lattice. The crystal exhibited several cracks over the 5 mm×5 mm area, giving the crack density of greater than 10 cm$^{-2}$.

By matching the electron concentration and/or oxygen concentration of seed crystal to that of grown part, crystal quality, lattice curvature and crack density are improved. Lattice curvature can have an absolute value that exceeds 10 m, and crack density can be less than 10 cm$^{-2}$ when electron concentration and/or oxygen concentration of seed and new crystal growth are matched.

Electron concentration and/or oxygen concentration can be matched by selecting an appropriate seed crystal with similar oxygen and/or electron concentration, by adjusting amount of oxygen present during growth of group III nitride material on the seed crystal, and/or by adjusting amount of oxygen present during growth of the group III nitride seed crystal.

Example 2

Following the process flow in FIG. 4, bulk crystals of GaN are grown simultaneously on both sides of seed crystals attached together on Ga face to form a compound seed. Single crystalline c-plane GaN seed crystals in approximately 10 mm×25 mm size with thickness of 542 microns were prepared. The seed crystals were prepared by the ammonothermal method. The electron concentration is, based on previous data for similar seeds, approximately 1×10$^{19}$ cm$^{-3}$ and oxygen concentration is, based on previous data for similar seeds, approximately 3×10$^{19}$ cm$^{-3}$. The full width half maximum (FWHM) of X-ray 002 peak measured on the N-side was 287 arcsec and the curvature radius was −1.95 m (convex towards −c axis).

Two of the seed crystals were attached together on their Ga faces so that only N-polar faces were exposed on both sides. Then, crystalline parts were grown on both sides of the seeds simultaneously in supercritical ammonia. The growth temperature was about 520° C., the ammonia fill factor was 55% and the sodium molar ratio to ammonia was 4.5%. The expected carrier concentration and oxygen concentration based on previous experiments are approximately 2×10$^{19}$ cm$^{-3}$ and 3×10$^{19}$ cm$^{-3}$, respectively. The ratio of electron concentration in the grown part to that of the seed is therefore calculated to be approximately 2, and the ratio of oxygen concentration in the grown part to that of the seed is therefore calculated to be approximately 1.

The total thickness of the bulk crystal grown on the seed was 4.8 mm and the X-ray FWHM from 002 diffraction obtained from one side of the crystal part was reduced to 99 arcsec. This indicates that crystal quality improves after growth. The curvature radius on the N-side crystal part increased from −1.95 m to 7.16 m, which shows flattened crystal lattice.

By matching the electron concentration or oxygen concentration of seed crystal to that of grown part, crystal quality and lattice curvature improve in this example. Again, as for other methods of this invention, electron concentration and/or oxygen concentration can be matched by selecting an appropriate seed crystal with similar oxygen and/or electron concentration, by adjusting amount of oxygen and/or dopant present during growth of group III nitride material on the seed crystal, and/or by adjusting amount of oxygen present during growth of the group III nitride seed crystal.

In other examples similar to those above, one or more dopants such as silicon, carbon, germanium, sulfur, and/or selenium are added during ammonothermal growth on ammonothermally-grown or HVPE-grown seeds in order to provide an electron concentration in new ammonothermal growth that is about the same as the electron concentration in the seed(s). Oxygen is optionally added along with the dopant(s). The seed may similarly have at least one of the dopants added during growth.

Advantages and Improvements

The bulk GaN crystal of this invention may have three parts: the first seed crystal, the first crystalline part grown on the first side of the first seed crystal and the second crystalline part grown on the second side of the first seed crystal. The electron concentration or the oxygen concentration of the seed crystal is designed to match those of the grown parts.

The bulk crystal may comprise the following four parts; the first seed crystal, the first crystalline part grown on the first side of the first seed crystal, the second seed crystal, and the second crystalline part grown on the first side of the second seed crystal. In this case, the second side of the second seed crystal is attached to the second side of the first seed crystal, and carrier concentration or the oxygen concentration of the first crystalline part grown on the first side of the first seed matches with those of the first seed and the carrier concentration or the oxygen concentration of the second crystalline part grown on the first side of the second seed matches with those of the second seed.

The matching of electron concentration or the oxygen concentration helps to improve crystal quality, reduce lattice bowing and reduce cracking.

The resulting improved-quality, reduced-bow, reduced-crack group III nitride crystals can be sliced to produce high-quality group III nitride wafers. Due to improved quality, improved bow, and reduced/eliminated cracks of the wafers, electronic/optoelectronic devices fabricated on such wafers can attain high performance.

Possible Modifications

Although the preferred embodiment describes bulk crystals of GaN, similar benefit of this invention can be expected for other group III nitride alloys of various composition, such as AlN, AlGaN, InN, InGaN, or GaAlInN.

Although the preferred embodiment describes GaN seed crystals fabricated by ammonothermal growth or HVPE, similar benefit of this invention can be expected for seed crystals fabricated by other growth method such as metalorganic vapor phase epitaxy, molecular beam epitaxy, flux method, high-pressure solution growth with appropriate matching of electron concentration or oxygen concentration.

Although the preferred embodiment describes GaN seed crystal having thickness about 500 microns, similar benefit of this invention can be expected for other thicknesses between 100 microns to 2000 microns.

Although the preferred embodiment describes c-plane GaN seed crystals, similar benefit of this invention can be expected for other faces such as a-face, m-face, and various semipolar surfaces of group III nitride crystals. Also, the surface of the seed crystal can be slightly miscut (off-sliced) from these orientations.

Although the preferred embodiment describes ammonothermal growth, similar benefit of this invention can be expected for other bulk growth methods such as a flux method or high-pressure, high-temperature solution growth.

Following are some examples of what is provided by the invention:

1. A bulk crystal of group III nitride having a composition of $Ga_xAl_yIn_{1-x-y}N$ (0≤x≤1, 0≤x+y≤1) and a thickness greater than 1 millimeter wherein the bulk crystal has at least three portions,
   (a) a first portion comprising a seed crystal having a first major face and a second major face, the first major face having an electron concentration, $N_{1seed}$, the first major face having an oxygen concentration $O_{1seed}$, the second major face having an electron concentration $N_{2seed}$, and the second major face having an oxygen concentration $O_{2seed}$;
   (b) a second portion on the first major face of the seed crystal and comprising a first crystalline region, wherein the first crystalline region has an electron concentration, $N_{1st-xtal}$, and an oxygen concentration $O_{1st-xtal}$,
   (c) a third portion on the second major face of the seed crystal and comprising a second crystalline region, wherein said second crystalline region has an electron concentration $N_{2nd-xtal}$, and an oxygen concentration $O_{2nd-xtal}$, and
   (d) wherein the electron concentration and/or the oxygen concentration of the seed crystal, the first crystalline region, and the second crystalline region satisfy at least one of the following relationships:

$0.1 < N_{1st-xtal}/N_{1seed} < 10$ and/or $0.1 < N_{2nd-xtal}/N_{2seed} < 10$; and/or $0.1 < O_{1st-xtal}/O_{1seed} < 10$ and/or $0.1 < O_{2nd-xtal}/O_{2seed} < 10$.

2. A bulk crystal according to paragraph 1 wherein the electron concentration and/or the oxygen concentration of the seed crystal, the first crystalline region, and the second crystalline region satisfy at least one of the following relationships:

$0.5 < N_{1st-xtal}/N_{1seed} < 5$ and/or $0.5 < N_{2nd-xtal}/N_{2seed} < 5$;

$0.5 < O_{1st-xtal}/O_{1seed} < 5$ and/or $0.5 < O_{2nd-xtal}/O_{2seed} < 5$.

3. A bulk crystal according to paragraph 1 or paragraph 2 wherein the seed crystal is a single crystal of said $Ga_xAl_yIn_{1-x-y}N$, the electron concentration and/or the oxygen concentration of said first crystalline region satisfies at least one of said relationships, and the electron concentration and the oxygen concentration of said second crystalline region do not satisfy at least one of said relationships.
4. A bulk crystal according to paragraph 1 or paragraph 2 wherein the seed crystal is a single crystal of said $Ga_xAl_yIn_{1-x-y}N$, the electron concentration and/or the oxygen concentration of said first crystalline region satisfies at least one of said relationships, and the electron concentration and/or the oxygen concentration of the second crystalline region additionally satisfies at least one of said relationships.
5. A bulk crystal according to any of paragraphs 1-4 wherein the first major face of the seed crystal is N-polar.
6. A bulk crystal according to paragraph 1 or paragraph 2 wherein the seed crystal is a composite crystal of said $Ga_xAl_yIn_{1-x-y}N$, and wherein the composite crystal comprises a first seed crystal piece of said $Ga_xAl_yIn_{1-x-y}N$ and a separate, second seed crystal piece of said $Ga_xAl_yIn_{1-x-y}N$ affixed to a major face of the first seed crystal piece.
7. A bulk crystal according to paragraph 6 wherein the electron concentration and/or the oxygen concentration of the first crystalline region satisfies at least one of said relationships and wherein the electron concentration and/or the oxygen concentration of the second crystalline region also satisfies at least one of said relationships.
8. A bulk crystal according to paragraph 7 wherein the electron concentration of the first crystalline region and the second crystalline region each satisfies at least one of said relationships.
9. A bulk crystal according to paragraph 7 or paragraph 8 wherein the oxygen concentration of the first crystalline region and the second crystalline region each satisfies at least one of said relationships.
10. A bulk crystal according to any of paragraphs 6-9 wherein the first major face of the seed crystal is N-polar and the second major face of the seed crystal is N-polar.
11. A bulk crystal according to any of paragraphs 1-10 wherein the seed crystal and the first and second crystalline regions of the bulk crystal were each formed under substantially the same growth conditions
12. A bulk crystal according to any of paragraphs 1-11 wherein the first crystalline region and the second crystalline region were formed simultaneously.
13. A bulk crystal according to any of paragraphs 1-12 wherein the first crystalline region and the second crystalline region were formed in supercritical ammonia.
14. A bulk crystal according to any of paragraphs 1-13 wherein the seed crystal was formed in supercritical ammonia.
15. A bulk crystal according to any of paragraphs 1-14 wherein said first crystalline region of the bulk crystal has a full width half maximum of an x-ray rocking curve less than a full width half maximum of an x-ray rocking curve of the seed crystal.
16. A bulk crystal according to any of paragraphs 1-15 wherein the first crystalline region has a radius of curvature of crystal lattice, the first major face of the seed crystal has a radius of curvature of crystal lattice, and an absolute value of the radius of curvature of the crystal lattice of the first crystalline region is greater than the absolute value of the radius of curvature of the crystal lattice of the first major face of the seed crystal.
17. A bulk crystal according to paragraph 16 wherein the absolute value of the radius of curvature of the crystal lattice of the first crystalline region exceeds 10 m.

18. A bulk crystal according to any of paragraphs 1-17 wherein the first crystalline region has a major face having a crack density less than 10 cm$^{-2}$.
19. A bulk crystal according to any of paragraphs 1-18 wherein the group III nitride is GaN.
20. A bulk crystal according to any paragraph above, wherein at least one of the first crystalline region and the second crystalline region of the bulk crystal has better crystal quality, better defect density, and/or better crack density than a comparative bulk crystal of equal thickness formed by a method identical to a method of forming the bulk crystal above except that oxygen concentration, dopant concentration, and/or electron concentration of new growth is not matched to oxygen concentration, dopant concentration, and/or electron concentration respectively of the seed crystal.
21. A wafer comprising a portion of a bulk crystal of any paragraph above.
22. A method of fabricating a bulk crystal of group III nitride comprising;
    (a) preparing a seed crystal of group III nitride, wherein the seed crystal has
        a first major face having an electron concentration of $N_{1seed}$ and an oxygen concentration of $O_{1seed}$ and
        a second major face having an electron concentration of $N_{2seed}$ and an oxygen concentration of $O_{2seed}$;
    (b) simultaneously growing a first crystalline portion of group III nitride on the first major face of the seed crystal and a second crystalline portion of group III nitride on the second major face of the second seed crystal wherein (i) an amount of oxygen present during the act of simultaneously growing the first crystalline portion and the second crystalline portion is adjusted and/or (ii) group III nitride growth conditions are selected so that at least one of the electron concentration of the first crystalline portion ($N_{1st\text{-}xtal}$), the oxygen concentration of the first crystalline portion ($O_{1st\text{-}xtal}$), the electron concentration of the second crystalline portion ($N_{2nd\text{-}xtal}$), and the oxygen concentration of the second crystalline portion ($O_{2nd\text{-}xtal}$) satisfy at least one of the following relationships:

$0.1 < N_{1st\text{-}xtal}/N_{1seed} < 10$ and/or $0.1 < N_{2nd\text{-}xtal}/N_{2seed} < 10$;

$0.1 < O_{1st\text{-}xtal}/O_{1seed} < 10$ and/or $0.1 < O_{2nd\text{-}xtal}/O_{2seed} < 10$.

23. A method according to paragraph 22 wherein the reaction conditions are selected so that at least one of the electron concentration of the first crystalline portion ($N_{1st\text{-}xtal}$), the oxygen concentration of the first crystalline portion ($O_{1st\text{-}xtal}$), the electron concentration of the second crystalline portion ($N_{2nd\text{-}xtal}$), and the oxygen concentration of the second crystalline portion ($O_{2nd\text{-}xtal}$) satisfy at least one of the following relationships:

$0.5 < N_{1st\text{-}xtal}/N_{1seed} < 5$ and/or $0.5 < N_{2nd\text{-}xtal}/N_{2seed} < 5$;

$0.5 < O_{1st\text{-}xtal}/O_{1seed} < 5$ and/or $0.5 < O_{2nd\text{-}xtal}/O_{2seed} < 5$.

24. A method according to paragraph 22 or paragraph 23 wherein the seed crystal is a single crystal of said group III nitride and the operating conditions are selected so that the electron concentration and/or the oxygen concentration of the first crystalline portion satisfies at least one of said relationships, and the electron concentration and the oxygen concentration of the second crystalline portion do not satisfy at least one of said relationships.
25. A method according to paragraph 22 or paragraph 23 wherein the seed crystal is a single crystal of said group III nitride, and the operating conditions are selected so that the electron concentration and/or the oxygen concentration of the first crystalline portion satisfies at least one of said relationships, and the electron concentration and/or the oxygen concentration of the second crystalline portion additionally satisfies at least one of said relationships.
26. A method according to any of paragraphs 22-25 wherein the first major face of the seed crystal is N-polar.
27. A method according to paragraph 22 or paragraph 23 wherein the seed crystal is a composite crystal comprising a first seed crystal piece of said group III nitride and a separate, second seed crystal piece of said group III nitride affixed to a major face of the first seed crystal piece.
28. A method according to paragraph 27 wherein the operating conditions are selected so that the electron concentration and/or the oxygen concentration of the first crystalline portion satisfies at least one of said relationships and wherein the electron concentration and/or the oxygen concentration of the second crystalline portion also satisfies at least one of said relationships.
29. A method according to paragraph 28 wherein the reaction conditions are selected so that the electron concentration of the first crystalline portion and the second crystalline portion each satisfies at least one of said relationships.
30. A method according to paragraph 28 or paragraph 29 wherein the reaction conditions are selected so that the oxygen concentration of the first crystalline portion and the second crystalline portion each satisfies at least one of said relationships.
31. A method according to any of paragraphs 27-30 wherein the first major face and the second major face of the composite seed crystal are each N-polar faces.
32. A method according to any of paragraphs 22-31 wherein the bulk crystal is grown in supercritical ammonia.
33. A method according to any of paragraphs 22-32 wherein the seed crystal is grown in supercritical ammonia.
34. A method according to any of paragraphs 22-33 wherein the group III nitride is GaN.
35. A method according to any of paragraphs 22-34 wherein the full width half maximum of the x-ray rocking curve from the bulk crystal is less than that of seed crystal.
36. A bulk crystal formed by a method of any of paragraphs 22-35 wherein the bulk crystal has a first major face and a second major face, and the absolute value of curvature radius of crystal lattice measured on the first major face, the second major face, or both the first major face and the second major face is greater than that of the original seed crystal.
37. A bulk crystal according to paragraph 36 wherein the curvature radius of the crystal lattice of the first major face, the second major face, or both the first major face and the second major face of the bulk crystal exceeds 10 m.
38. A bulk crystal according to paragraph 36 or paragraph 37 wherein crack density on the first major face, the second major face, or the first major face and the second major face of the bulk crystal is less than 10 cm$^{-2}$.

The examples above do not limit the scope of the invention. The invention is to be construed broadly in view of the discussion above and the following claims.

What is claimed is:

1. A bulk crystal of group III nitride having a composition of Ga$_x$Al$_y$In$_{1-x-y}$N (0≤x≤1, 0≤x+y≤1) and a thickness greater than 1 millimeter wherein the bulk crystal has at least three portions,
    (a) a first portion comprising a seed crystal containing a donor dopant other than oxygen and having a first major face and a second major face, the first major face having an electron concentration, N$_{1seed}$, and the second major face having an electron concentration N$_{2seed}$;
    (b) a second portion on the first major face of the seed crystal and comprising a first crystalline region, wherein the first crystalline region has an electron concentration, N$_{1st-xtal}$,
    (c) a third portion on the second major face of the seed crystal and comprising a second crystalline region, wherein said second crystalline region has an electron concentration N$_{2nd-xtal}$, and
    (d) wherein the electron concentration of the seed crystal, the first crystalline region, and the second crystalline region satisfy the following relationship:

0.1<N$_{1st-xtal}$/N$_{1seed}$<10 and/or 0.1<N$_{2nd-xtal}$/N$_{2seed}$<10.

2. A bulk crystal according to claim 1 wherein the electron concentration of the seed crystal, the first crystalline region, and the second crystalline region satisfy the following relationship:

0.5<N$_{1st-xtal}$/N$_{1seed}$<5 and/or 0.5<N$_{2nd-xtal}$/N$_{2seed}$<5.

3. A bulk crystal according to claim 1 wherein the seed crystal is a single crystal of said Ga$_x$Al$_y$In$_{1-x-y}$N, the electron concentration of said first crystalline region satisfies said relationship, and the electron concentration of the second crystalline region does not satisfy said relationship.

4. A bulk crystal according to claim 1 wherein the seed crystal is a composite crystal of said Ga$_x$Al$_y$In$_{1-x-y}$N, and wherein the composite crystal comprises a first seed crystal piece of said Ga$_x$Al$_y$In$_{1-x-y}$N and a separate, second seed crystal piece of said Ga$_x$Al$_y$In$_{1-x-y}$N affixed to a major face of the first seed crystal piece.

5. A bulk crystal according to claim 4 wherein the electron concentration of the first crystalline region satisfies said relationship and wherein the electron concentration of the second crystalline region also satisfies said relationship.

6. A bulk crystal according to claim 4 wherein the first major face of the seed crystal is N-polar and the second major face of the seed crystal is N-polar.

7. A bulk crystal according to claim 1 wherein said first crystalline region of the bulk crystal has a full width half maximum of an x-ray rocking curve less than a full width half maximum of an x-ray rocking curve of the seed crystal.

8. A bulk crystal according to claim 1 wherein the first crystalline region has a radius of curvature of crystal lattice, the first major face of the seed crystal has a radius of curvature of crystal lattice, and an absolute value of the radius of curvature of the crystal lattice of the first crystalline region is greater than the absolute value of the radius of curvature of the crystal lattice of the first major face of the seed crystal.

9. A bulk crystal according to claim 8 wherein the absolute value of the radius of curvature of the crystal lattice of the first crystalline region exceeds 10 m.

10. A bulk crystal according to claim 1 wherein the first crystalline region has a major face having a crack density less than 10 cm$^{-2}$.

11. A bulk crystal according to claim 1 wherein the group III nitride is GaN.

12. A bulk crystal according to claim 1, wherein at least one of the first crystalline region and the second crystalline region of the bulk crystal has better crystal quality, better defect density, and/or better crack density than a comparative bulk crystal of equal thickness formed by a method identical to a method of forming the bulk crystal above except that electron concentration of new growth is not matched to electron concentration of the seed crystal.

13. A method of fabricating a bulk crystal of group III nitride comprising;
    (a) preparing a seed crystal of group III nitride, wherein the seed crystal has a donor dopant other than oxygen and a first major face having an electron concentration of N$_{1seed}$ and a second major face having an electron concentration of N$_{2seed}$;
    (b) simultaneously growing a first crystalline portion of group III nitride on the first major face of the seed crystal and a second crystalline portion of group III nitride on the second major face of the second seed crystal wherein group III nitride growth conditions are selected so that the electron concentration of the first crystalline portion (N$_{1st-xtal}$) and the electron concentration of the second crystalline portion (N$_{2nd-xtal}$) satisfy the following relationship:

0.1<N$_{1st-xtal}$/N$_{1seed}$<10 and/or 0.1<N$_{2nd-xtal}$/N$_{2seed}$<10.

14. A method according to claim 13 wherein the reaction conditions are selected so that the electron concentration of the first crystalline portion (N$_{1st-xtal}$) and the electron concentration of the second crystalline portion (N$_{2nd-xtal}$) satisfy the following relationship:

0.5<N$_{1st-xtal}$/N$_{1seed}$<5 and/or 0.5<N$_{2nd-xtal}$/N$_{2seed}$<5.

15. A method according to claim 13 wherein the seed crystal is a single crystal of said group III nitride and the operating conditions are selected so that the electron concentration satisfies said relationship and the electron concentration of the second crystalline portion does not satisfy said relationship.

16. A method according to claim 13 wherein the seed crystal is a single crystal of said group III nitride, and the operating conditions are selected so that the electron concentration of the first crystalline portion satisfies said relationship and the electron concentration of the second crystalline portion additionally satisfies said relationship.

17. A method according to claim 13 wherein the seed crystal is a composite crystal comprising a first seed crystal piece of said group III nitride and a separate, second seed crystal piece of said group III nitride affixed to a major face of the first seed crystal piece.

18. A method according to claim 17 wherein the composite crystal has a first exposed major face and a second exposed major face and wherein each of the first and second exposed major faces are N-polar.

19. A method according to claim 17 wherein the operating conditions are selected so that the electron concentration of the first crystalline portion satisfies said relationship and wherein the electron concentration of the second crystalline portion also satisfies said relationship.

20. A method according to claim 13 wherein the bulk crystal is grown in supercritical ammonia.

21. A method according to claim 13 wherein the seed crystal is grown in supercritical ammonia.

22. A method according to claim 13 wherein the group III nitride is GaN.

23. A bulk crystal formed by a method of claim 13 wherein the bulk crystal has a first major face and a second major face, and the absolute value of curvature radius of crystal lattice measured on the first major face, the second major face, or both the first major face and the second major face is greater than that of the original seed crystal.

24. A method according to claim 13 wherein the seed crystal is grown by hydride vapor phase epitaxy.

25. A method according to claim 13 in which the donor dopant is selected from silicon, carbon, germanium, sulfur, and selenium.

26. A method according to claim 13 wherein oxygen is also added along with the donor dopant.

27. A bulk crystal according to claim 1 in which the donor dopant is selected from silicon, carbon, germanium, sulfur, and selenium.

28. A bulk crystal according to claim 1 wherein oxygen is also included along with the donor dopant.

* * * * *